Feb. 28, 1961 W. E. BRADLEY 2,973,489

FREQUENCY SELECTIVE CIRCUIT

Filed Jan. 10, 1956

INVENTOR.
WILLIAM E. BRADLEY
BY
Allen V. Hazeltine
ATTORNEY

United States Patent Office 2,973,489

Patented Feb. 28, 1961

2,973,489

FREQUENCY SELECTIVE CIRCUIT

William E. Bradley, New Hope, Pa., assignor to Philco Corporation, Philadelphia, Pa., a corporation of Pennsylvania Filed Jan. 10, 1956, Ser. No. 558,295

7 Claims. (Cl. 333—76)

The present invention relates to resonant circuits and more particularly to circuits which have undamped resonance modes at one frequency and not at any other frequency.

In radio circuits it is frequently necessary to minimize the effect of stray capacitance of useful circuit elements such as vacuum tubes, crystals, etc. by resonating these capacitances with a circuit having an inductive impedance at the desired frequency of operation. Preferably there should be an active resonance at the desired frequency of operation but at no other frequency. In other instances it is necessary to couple two different elements, such as the plate of one vacuum tube to the grid of another or an antenna to a crystal mixer. In general it is desirable that the coupling be a maximum at the desired frequency of operation and zero at all other frequencies. For example, in radio wave receivers operating in the UHF and microwave range, reception can occur at other than the desired signal frequency due to higher modes of resonance of the network including the mixer crystal of the receiver. Signals having frequencies corresponding to the frequencies of these higher modes of resonance may beat with harmonics of the local oscillator signal to produce unwanted signals or noise in the output of the receiver. These higher modes of resonance become especially objectionable above about four hundred megacycles since at this frequency lumped constant circuits begin to exhibit some of the characteristics of distributed parameter circuits and the distinction between lumped constant circuits and distributed parameter circuits is not clearly defined. It has been found that many practical UHF television mixer circuits and many radar circuits have active resonances two or three octaves above their normal operating frequencies.

In circuits of the prior art considerable attention has been paid to enhancing the resonance at the desired operating frequency but the circuits of which I am aware all have higher modes of resonance either at integer multiples or at non-integer multiples or at both integer multiples and non-integer multiples of the desired frequency of operation. The long transmission line short-circuited at one end is one example of a circuit having active resonances at integer multiples and non-integer multiples of the desired frequency of operation. The long transmission line shunted by resistors at the voltage nodes of the resonance mode of the desired frequency of operation is an example of a circuit having active resonances at integer multiples of the desired frequency of operation but not at non-integer multiples of this frequency. An inductance shunted by a capacitance, the inductance having a non-uniform turns spacing throughout its length is an example of a circuit having active resonances at non-integer multiples of the desired frequency of operation. In many instances the higher order modes of resonance are disregarded in the design of electrical circuits in the belief that no convenient way exists for eliminating them.

Therefore it is an object of the present invention to provide a novel circuit which has an undamped mode of resonance at one frequency and at no other frequency.

It is a further object of this invention to provide a circuit for use in conjunction with UHF mixers or the like for blocking signals at all frequencies other than the desired frequency of reception.

Still another object of the invention is to provide a circuit which will resonate with a selected circuit reactance at only one frequency.

A further object of the present invention is to provide a circuit for coupling two circuit elements at only one selected frequency.

Still another object of the invention is to provide a circuit which may be employed in conjunction with known frequency selection circuits for suppressing resonances at frequencies other than the desired operating frequency.

In general these and other objects of the invention are accomplished by incorporating the reactance to be neutralized or one of the circuit elements to be coupled into a circuit which is series resonant at the desired frequency of operation. A second circuit is connected across the terminals of this series circuit. This second circuit may include the second circuit element to be coupled or it may include circuit elements whose only function is to resonate with the circuit reactance. This second circuit is arranged so that it is series resonant at the desired operating frequency. In addition the arrangement or composition of the two circuits are so selected that there is no other frequency at which both of the circuits are series resonant. Stated in another way, at the desired operating frequency the input impedance of each circuit is zero but there is no other frequency at which the two impedances are both zero. The circuit is completed by connecting a damping resistor across the common terminals of the two circuits.

For a better understanding of the invention together with other and further objects thereof, reference should now be made to the following detailed description which is to be read in conjunction with the accompanying drawings in which.

Figure 1:
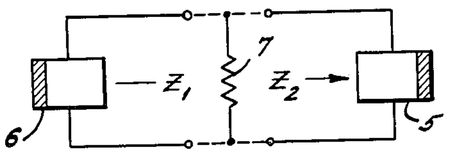
Fig. 1 is a diagram illustrating the broad concept of the present invention.

Turning now to Fig. 1, block 5 represents a circuit which may include a useful circuit element such as a vacuum tube, crystal or the like. This useful element is represented by the shaded portion of block 5. The term "useful circuit element" is employed to describe the portion of the circuit which connects the resonant circuit of the present invention to the remainder of the radio receiver or the like. The unshaded portion of block 5 schematicaly represents that additional circuit elements may be combined with the useful circuit element to cause the input impedance $Z_2$ to be zero at the desired operating frequency. $Z_2$ may be, and usually will be, zero at other particular frequencies also. Block 6 represents a second circuit which has an input impedance $Z_1$ which is zero at the desired operating frequency and which may be zero at other particular frequencies provided that $Z_1$ and $Z_2$ are never again zero at the same frequency. The shaded portion of block 6 schematically represents that the circuit represented by block 6 may include a second useful circuit element. The circuit of Fig. 1 is completed by joining the terminals associated with block 5 to the terminals of block 6 and connecting a damping resistor 7 between the two common terminals thus formed. At the desired frequency of operation no voltage will appear across resistor 7 since the impedances $Z_1$ and $Z_2$ are both zero. At all frequencies other than the desired frequency of operation resistor 7 will have a damping effect since, even though the combined circuits of blocks 5 and 6 may resonate at certain frequencies, the voltage across resistor 7 will be other than zero.

In order to insure that $Z_1$ and $Z_2$ are never both zero at any frequency other than the desired frequency of operation it is desirable that the circuit elements represented by blocks 5 and 6 be simple structures in which the zero values may be predicted over several octaves. A uniform short-circuited transmission line is one such simple structure. A uniform transmission line terminated in a pure lumped reactance is another structure having predictable zero values of input impedances. In general the zero values of input impedance for a transmission line terminated in a lumped reactance will not occur at the same frequencies as the zero values of input impedance for a short-circuited transmission line.

Figure 2:
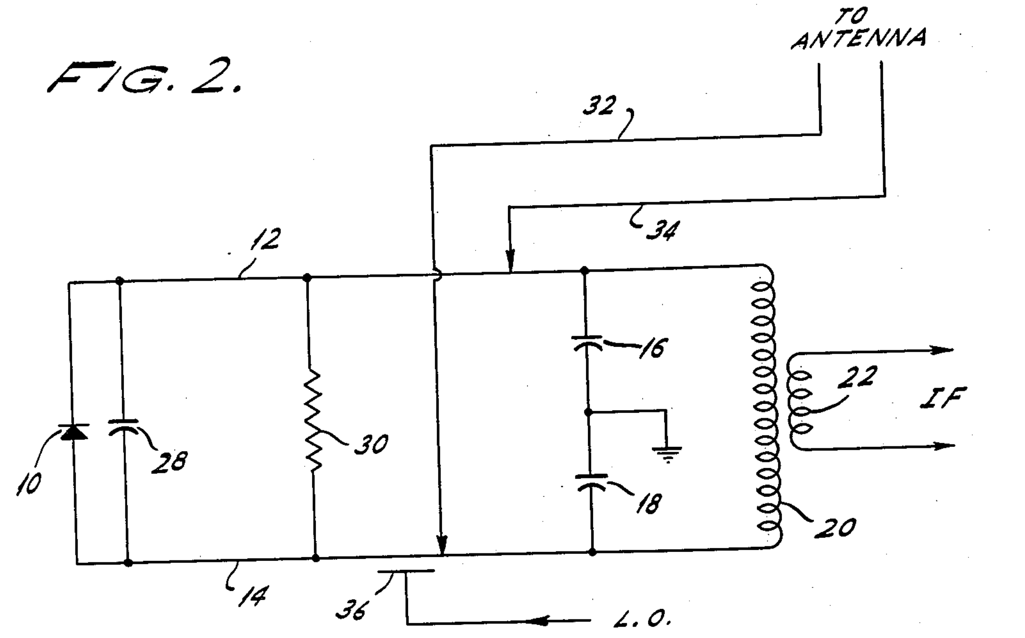
Fig. 2 is a simplified schematic of one preferred embodiment of the invention employed in the mixer circuit of a radio receiver.

Fig. 2 is a schematic diagram of a preferred embodiment of the invention arranged in accordance with the block diagram of Fig. 1 but employing the simple, predictable structures mentioned above.

In Fig. 2 a mixer crystal 10 is shown connected to the two conductors 12 and 14 of a radio wave transmission means. The radio wave transmission means may be an open wire transmission line, a coaxial transmission line or a waveguide. For obvious reasons the coaxial transmission line and the waveguide are preferred at ultrahigh frequencies and microwave frequencies, respectively. Since the means for and manner of connecting a mixer crystal to any one of the three enumerated wave transmission means is now well known, Fig. 2 may serve as an illustration for all three forms of the circuit.

The transmission means 12—14 is terminated at its right hand end by two capacitors 16 and 18. Capacitors 16 and 18 provide a short-circuit termination for the right hand end of transmission means 12—14 at the desired reception frequency. The mid-point of the series combination of capacitors 16 and 18 is connected to ground. This causes conductors 12 and 14 to be balanced with respect to ground. As is well known, it is customary and desirable to operate the outer conductor of a coaxial line at ground potential. Therefore, for coaxial lines and waveguides the series combination of the two capacitors 16 and 18 may be replaced by a single capacitor.

An inductor 20 is connected in shunt with the series combination of capacitors 16 and 18. The parallel combination of inductor 20 and capacitors 16 and 18 is made resonant at the desired I.F. frequency and forms the I.F. frequency load for mixer crystal 10. A secondary winding 22, which is magnetically coupled to indicator 20, is provided as a means for coupling the circuit of Fig. 1 to a suitable I.F. amplifier.

The transmission means represented by conductors 12 and 14 is made other than an integral number of quarter wavelengths long at the desired reception frequency. Hence the transmission means, by itself, is not resonant at the desired reception frequency. A lumped impedance 28 is provided at the left hand end of the transmission means adjacent mixer crystal 10 for tuning the transmission means to resonance at the desired reception frequency. Impedance 28 may be a capacitor as shown or it may be an inductor for other lengths of transmission means. For example, if the transmission means 12—14 is ⅝ of a wavelength long at the desired reception frequency, measured from capacitor 28 to capacitors 16 and 18, capacitor 28 should provide a reactance at the desired reception frequency which is equal in magnitude to the characteristic impedance of the transmission means. If the transmission means is greater than one wavelength long but less than one and one-half wavelengths long, an inductive tuning reactance is required. A capacitive termination is preferred since it is easier to realize at ultrahigh and microwave frequencies than an inductive termination.

The capacitive tuning reactance 28 shown in Fig. 2 may be a conventional parallel plate capacitance for open wire lines. In coaxial lines it is usually more convenient to employ a cylindrical capacitor formed by a conductive sleeve electrically joined to one conductor and spaced from the other conductor by a very thin dielectric layer. In waveguides the capacitive tuning element may take the form of a suitably proportioned iris or a suitable lumped constant capacitor may be employed.

The length of transmission line 12—14 is so selected that a voltage node occurs between the short-circuit termination provided by capacitors 16 and 18 and the resonating impedance 28. In a ⅝ wavelength line this voltage node will occur at a position displaced from the short-circuit termination by one-half a wavelength. An energy dissipative element such as resistor 30 is connected between conductors 12 and 14 at the position of this voltage node.

The antenna circuit and the local oscillator may be coupled to crystal 10 in a conventional manner. As shown in Fig. 2 leads 32 and 34 may be connected to conductors 12 and 14 at points so spaced from the short-circuited end of the transmission line that the impedance of the transmission line, as seen from conductors 32 and 34, is equal to the impedance of the antenna circuit. The local oscillator may be loosely coupled to one of the conductors 12 or 14 by placing a suitable conductor or plate 36 adjacent to the transmission line.

Figure 3:
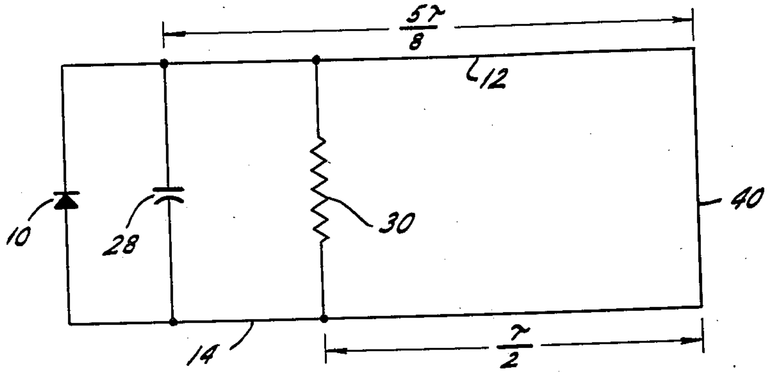
Fig. 3 is a radio frequency equivalent circuit of the mixer circuit of Fig. 2.

As mentioned above, the novelty of the present invention resides in the novel arrangement of terminating impedances and damping elements and not in the connection thereto of the local oscillator, the antenna circuit or the I.F. circuit. Therefore it will be more convenient to explain the operation of the present invention in terms of the radio frequency equivalent circuit of Fig. 3. In Fig. 3 capacitors 16 and 18 have been replaced by the short-circuit termination 40. All other elements in Fig. 3 correspond to elements in Fig. 2 and they have been given corresponding reference numerals.

It will be seen that the half wavelength section of transmission line to the right of resistor 30 comprises a circuit which meets the limitations imposed on the circuit represented by block 5 of Fig. 1. Similarly the combination of the ⅛ wavelength section of transmission line to the left of resistor 30 and the terminating capacitor 28 meets the limitations imposed on the circuit represented by block 6 of Fig. 1. Resistor 30 corresponds to resistor 7 of Fig. 1.

The fact that the circuit of Fig. 3 has only one undamped frequency of resonance it is more easily demonstrated if the point of reference is moved from the terminals of resistor 30 to the terminals of capacitor 28. In order for the circuit of Fig. 3 to be resonant at the desired operating frequency the condition of Equation 1 must be met.

$$\frac{1}{Z_0}+\frac{1}{Z_c}=0 \qquad (1)$$

where $Z_0$ is the input impedance of the transmission line and $Z_c$ is the impedance of capacitor 28 at the desired frequency of resonance.

For a non-dissipative line terminated in a short circuit:

$$\frac{1}{Z_0}=\frac{-i}{K}\frac{\cos \beta l}{\sin \beta l} \qquad (2)$$

where $i$ is the square root of $-1$,
$K$ is the characteristic impedance of the transmission line,
$l$ is the length of the transmission line and,
$\beta$ is the phase shift constant of the transmission line.

For capacitor 28 at resonance:

$$\frac{1}{Z_c}=i\omega C_1 \tag{3}$$

where $\omega=2\pi f_r$,
$f_r$=is the frequency of resonance, and
$C_1$=is the capacitance of capacitor 28

Substituting (2) and (3) in (1) it is found that:

$$\omega C_1 K=\cot\beta l \tag{4}$$

Substituting:

$$\beta=\omega\sqrt{LC_o}$$

$$K=\sqrt{\frac{L}{C_o}}$$

$$C_1=\frac{4l}{5\pi}C_o$$

where L is the inductance per unit length of the transmission line, and $C_c$ is the capacitance per unit length of the transmission line, it can be seen that:

$$\frac{4}{5\pi}[\omega l\sqrt{LC_c}]=\cot[\omega l\sqrt{LC_c}] \tag{5}$$

let $\mu=[\omega l\sqrt{LC_c}]$ then $$\frac{4}{5\pi}\mu=\cot\mu \tag{6}$$

which may be rewritten as:

$$\frac{4}{5\pi}\sin\mu=\frac{\cos\mu}{\mu} \tag{7}$$

but $\mu$=the electrical length of the transmission line in radians. Nodes will occur at the same point on the transmission line only for lengths $\mu$ and $\mu+2n\pi$ where $n$ is an integer.

But $$\frac{\cos X}{X}$$

is an oscillating function whose amplitude, at intervals of $2\pi$ radians, decreases with increasing X while sin $X$ is a periodic function having the same period as $$\frac{\cos X}{X}$$

but having a constant amplitude at intervals of $2\pi$ radians. Thus Equation 7 cannot be satisfied by values $(\mu+2n\pi)$. Therefore there is but one value of frequency which satisfies the two conditions that the circuit of Fig. 3 is resonant and that a voltage is not present at the position of element 30.

Returning briefly to the circuit of Fig. 2 it will be seen that at one frequency and only one frequency the input impedance of transmission means 12—14 in shunt with the resonating impedance 28 will be substantially infinite with a zero resistive component. As a result, the signals at the desired frequency of reception will be supplied to crystal 10 with little or no attenuation. At all other frequencies the circuit shunting crystal 10 will have a resistive component of impedance which will attenuate the unwanted signals which may be supplied to the transmission means 12—14 by way of conductors 32 and 34.

It will be seen that the above result is not a function of the size of $C_1$ and that other values of $C_1$, $K$ and $d$ will still give one unique undamped frequency of resonance. It can also be shown that the substitution of an inductive termination for the capacitive termination will give rise to a similar result.

In some instances the two circuits corresponding to blocks 5 and 6 may both comprise transmission lines terminated by capacitors or inductors. For example the transmission line sections may be of different length and the capacitors may be of different value. Again the condition must be satisfied that the zero in the impedance-frequency characteristic of one circuit must occur at frequencies different from the zeros of the impedance-frequency characteristic of the other circuit for all frequencies except the desired operating frequency. It should be remembered that the statement that the zeros of the impedance-frequency characteristics of the two circuits occur at different frequencies is not quite the same as saying that the impedances of the two circuits are different functions of frequency. While it is true that, in general, impedance characteristics which are different functions of frequency will not have zeros at the same frequency, this condition does not always hold true.

Other forms of predictable or measurable structures may be employed in place of transmission lines. These other forms of circuit elements include stepped transmission lines and spherical, ellipsoidal or conical resonators.

Physically long coils may be made to have a single undamped resonant frequency by connecting a capacitor from each end of the coil to ground, the capacitors being of unequal value. A damping resistor connected from a voltage node on the coil to ground will damp all resonances except the desired one. The unequal size of the capacitors will cause the portions of the circuit on either side of the resistor to have different impedance vs. frequency characteristics. The probability that the characteristics of the two halves of the circuit will have zero values of impedance at the same frequency may be further reduced if the turns spacing of the inductor is made non-uniform in the portions on either side of the resistor so that further variations are introduced in the impedance vs. frequency characteristics.

Up until now the damping impedance has been represented by a single resistor. It can be shown that the single resistor may be replaced by a four-terminal network which presents a resistive termination at input and output terminals. The use of this four terminal network is useful in coupling circuits since it introduces another variable which may be employed to minimize coupling at unwanted frequencies.

Figure 4:
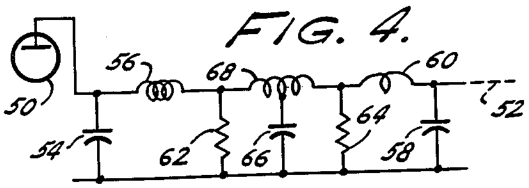
Fig. 4 is a simplified schematic of an interstage coupling network embodying the present invention.

Fig. 4 illustrates a coupling circuit arranged in accordance with the teachings of the present invention. The circuit of Fig. 4 is arranged to couple the anode 50 of one vacuum tube to the grid 52 of the same or another vacuum tube. Capacitor 54 and inductor 56 form one circuit having zeros in the impedance-frequency characteristic at certain frequencies. Capacitor 58 and inductor 60 form a second circuit having one zero at the frequency of one zero of the first circuit and other zeros at frequencies different from those of the first circuit. Resistors 62 and 64, capacitor 66 and inductor 68 comprise a four terminal network which replaces the resistor 7 of Fig. 1. Capacitor 66 and inductor 68 may be made resonant at the frequency of the common zero of the two end circuits and anti-resonant at all other zeros of either end circuit. Preferably capacitors 54, 66 and 58 are of different value and inductors 56, 68 and 60 have different physical and electrical characteristics. It should be noted that the three inductors 56, 68 and 60 may be replaced by a single inductor having non-uniform turns spacing in which case capacitors 54, 66 and 58 may comprise the stray capacitances of the coil.

While the invention has been described with reference to the preferred embodiments thereof, it will be apparent that various modifications and other embodiments thereof will occur to those skilled in the art within the scope of the invention. Accordingly I desire the scope of my invention to be limited only by the appended claims.

What is claimed is:

1. A circuit having an undamped mode of resonance at only one frequency, said circuit comprising: a two-conductor transmission line, said transmission line being terminated in a short circuit at a first end thereof, said transmission line being substantially ⅝ of a wave-length long at a preselected frequency, a capacitor having a reactance at said preselected frequency which is equal in magnitude to the characteristic impedance of said transmission line, said capacitor terminating said transmission line at a second end thereof, a dissipative element connected across said transmission line at a point one-half wavelength from said short-circuited end at said preselected frequency and means coupled to said two-conductor transmission line at points remote from the points of coupling of said dissipative element to said transmission line for supplying a signal to and extracting a signal from said circuit.

2. A signal transfer circuit having an undamped mode of resonance at only one frequency, said circuit comprising a first two terminal portion so constructed as to have zero values of impedance across the terminals thereof only at a first set of frequencies, a second two terminal portion so constructed as to have zero values of impedance across the terminals thereof only at a second set of frequencies, only one frequency of said first set corresponding to a frequency of said second set, the first and second terminals of said first portion being connected to the first and second terminals, respectively, of said second portion, a resistive network connected from said first terminals to said second terminals, means for supplying a signal to said circuit at a point remote from said first and second terminals, and means for extracting a signal from said circuit at a point remote from said first and second terminals.

3. A signal transfer circuit having an undamped mode of resonance at only one frequency, said circuit comprising a first transmission line section, a first impedance connected across a first end of said first transmission line section, the impedance of the combination of said first transmission line section and said first impedance as seen from the second end of said transmission line section being zero at a first set of frequencies, a second transmission line section, a second impedance connected across a first end of said second transmission line section, the impedance of the combination of said second transmission line section and said second impedance as seen from the second end of said second transmission line section being zero at a second set of frequencies, only one frequency of said first set corresponding to a frequency of said second set, said second end of said first transmission line section being connected to said second end of said second transmission line section, a resistor connected across said joined second end of said transmission line sections, means for supplying a signal to said signal transfer circuit at a point remote from said joined second ends, and means for extracting a signal from said signal transfer circuit at a point remote from said joined second ends.

4. A signal transfer circuit having an undamped mode of resonance at only one frequency, said circuit comprising: a wave transmission means, said wave transmission means being terminated in a short circuit at a first end thereof, said wave transmission means having a length greater than ½ wavelength and less than one wavelength at a preselected frequency, a capacitor circuit element terminating the second end of said transmission means, the combination of said wave transmission means and said capacitive circuit element being resonant at said preselected frequency, a dissipative element connected across said wave transmission means at a point ½ wavelength from said short circuited end at said preselected frequency, means for supplying energy to said signal transfer circuit at a point electrically displaced from said dissipative element, and means for extracting a signal from said signal transfer circuit at a point electrically displaced from said dissipative element.

5. A signal transfer circuit having an undamped mode of resonance at only one frequency, said circuit comprising: a wave transmission means, said wave transmission means being terminated in a short circuit at a first end thereof, said wave transmission means being substantially ⅝ of a wavelength long at a preselected frequency, a capacitor having a reactance at said preselected frequency which is equal in magnitude to the characteristic impedance of said wave transmission means, said capacitor terminating said first wave transmission means at a second end thereof, a dissipative element connected across said wave transmission means at a point ½ wavelength from said short circuited end at said preselected frequency, means for supplying a signal to said signal transfer circuit at a point displaced from said dissipative element and means for extracting a signal from said signal transfer circuit at a point displaced from said dissipative element.

6. A circuit having an undamped mode of resonance at only one frequency, said circuit comprising: an electrically long circuit element, first termination means connected to one end of said circuit element, said first means having an impedance which changes substantially with changes in frequency at frequencies above said one frequency of resonance, second termination means connected to the other end of said circuit element and having an impedance which is substantially frequency insensitive at frequencies above said one frequency of resonance, said circuit element and said two last-mentioned means being resonant at said one frequency of resonance, the length of said circuit element being such that, at one said frequency of resonance, the voltage distribution along said circuit element is non-uniform with a voltage node at a point displaced from both of said first and second means and such that no voltage node appears at said point at any other frequency at which said circuit element and said two last-mentioned elements are resonant, and a dissipative element connected between said circuit element at the position of said voltage node and a second point of equal potential.

7. A circuit having an undamped mode of resonance at only one frequency, said circuit comprising: a wave transmission means having first and second ends which are physically and electrically spaced apart, first means coupled to and terminating said wave transmission means at said first end, said first means having an impedance which changes substantially with changes in frequency at frequencies above said one frequency of resonance, second means coupled to and terminating said wave transmission means at said second end, said second means terminating said wave transmission means at said second end in an impedance which is substantially frequency insensitive at frequencies above said one frequency of resonance, said wave transmission means and said two terminating means being resonant at said one frequency of resonance, the length of said wave transmission means being such that, at said one frequency of resonance, a voltage node exists at a point on said wave transmission means displaced from both said terminating means and such that no voltage node occurs at said point at any other frequency at which said transmission means and said two terminating means are resonant, and a dissipative element connected to said wave transmission means at the position of said voltage node.

References Cited in the file of this patent

UNITED STATES PATENTS

| | | |
|---|---|---|
| 1,315,584 | Vreeland | Sept. 9, 1919 |
| 2,202,700 | Leeds | May 28, 1940 |
| 2,270,949 | Hulster | Jan. 27, 1942 |
| 2,589,259 | Isely | Mar. 18, 1952 |
| 2,694,186 | Kinzer et al. | Nov. 9, 1954 |
| 2,802,992 | Doelz | Aug. 13, 1957 |